(12) United States Patent
McIntyre

(10) Patent No.: US 9,961,631 B2
(45) Date of Patent: May 1, 2018

(54) POWER SAVING TRANSCEIVER SWITCH CONFIGURATION

(71) Applicant: HARRIS CORPORATION, Melbourne, FL (US)

(72) Inventor: John R. McIntyre, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 402 days.

(21) Appl. No.: 14/620,296

(22) Filed: Feb. 12, 2015

(65) Prior Publication Data

US 2016/0242113 A1   Aug. 18, 2016

(51) Int. Cl.
*H04W 52/02* (2009.01)
*H03H 7/46* (2006.01)
*H04B 1/44* (2006.01)

(52) U.S. Cl.
CPC ........ *H04W 52/0209* (2013.01); *H03H 7/465* (2013.01); *H04B 1/44* (2013.01); *Y02D 70/00* (2018.01)

(58) Field of Classification Search
CPC .. H04W 52/0209; H04W 52/02; H03H 7/465; H03H 7/48; H04B 1/44; H04B 1/38; H04B 1/006; H04B 1/0458; H04B 1/18; Y02D 70/00; H03K 17/687; H03K 17/76; H03K 17/16; H03K 3/012; H03K 17/161; H03F 3/213; H03F 3/195; H03F 3/211; H03F 23/645
See application file for complete search history.

(56) References Cited

U.S. PATENT DOCUMENTS

| | | |
|---|---|---|
| 8,680,947 B1 | 3/2014 | Costa et al. |
| 2013/0234806 A1 | 9/2013 | Schmidhammer et al. |
| 2015/0349770 A1 * | 12/2015 | Bakalski ............... H04B 1/006 |
| | | 455/78 |

FOREIGN PATENT DOCUMENTS

DE   102011101756 A1 * 11/2012   ............... H03H 9/72

OTHER PUBLICATIONS

Extended European Search Report dated Sep. 9, 2016 for European Patent No. 16000040.2.

(Continued)

*Primary Examiner* — Kwang B Yao
*Assistant Examiner* — Hardikkumar Patel
(74) *Attorney, Agent, or Firm* — Fox Rothschild LLP; Robert J. Sacco; Carol E. Thorstad-Forsyth

(57) ABSTRACT

Wireless transceiver includes a plurality of RF filters. A first band switching network includes a first plurality of RF switches to selectively direct transmitter RF energy to a selected RF filter. A second band switching network includes a second plurality of RF switches which selectively controls which of RF filter is connected to an antenna port. A receiver RF switch is connected to at least one of the RF filters and to a receiver input to selectively permit the received RF energy arriving at one RF filter to be communicated to the receiver. Each RF switch is a PIN diode type with at least one series diode provided along a signal path. No more than two PIN diodes are present in the signal path between the common transmitter port and the common antenna port when any of the RF filters is in use.

19 Claims, 4 Drawing Sheets

(56) References Cited

OTHER PUBLICATIONS

Hamerman, D., et al., "Low Reverse Voltage Ku-Band 10W MMIC SPDT Tx/Rx Switch Using Offset PIN diodes," Microwaves, Communications, Antennas and Electronics Systems, COMCAS 2009, IEEE International Conference, Nov. 9, 2009, pp. 1-4, XP031614796, ISBN: 978-1-4244-3985-0.

* cited by examiner

POWER SAVING TRANSCEIVER SWITCH CONFIGURATION

BACKGROUND OF THE INVENTION

Statement of the Technical Field

The inventive arrangements relate to radio transceivers and more particularly to power saving switching configurations for multi-band transceivers that use multiple harmonic transmitter filters.

Description of the Related Art

A PIN diode is a diode with a wide, un-doped or lightly doped intrinsic semiconductor region that resides between a p-type semiconductor and an n-type semiconductor region. Under conditions where the PIN diode has zero bias or is reversed biased, it has a relatively low capacitance such that it presents a high insertion loss to a radio frequency (RF) signal. However, when the PIN diode is forward biased with sufficient current it will have only minimal resistance to RF signals (e.g. about 1 ohm). Due to these characteristics, PIN diodes are often used to form RF switches.

One example switch configuration using PIN diodes comprises a series-shunt configuration. A series-shunt configuration PIN diode switch is conventionally used to achieve a relatively high isolation, which may be particularly important in high frequency applications, for example at or above 1 GHz. To achieve the relatively high isolation in a high power application, for example >10 W, a relatively high reverse bias voltage is used. The series diode and shunt diode of a particular switched path must be forward and reversed biased complementarily to minimize insertion loss and maximize isolation.

In transceivers, a transmit/receive (T/R) switch is often require to switch an antenna between the transmitter and receiver. However, switches (including PIN diode switches) are known to introduce insertion loss in the RF path. Such insertion loss will commonly range from 0.1 to 0.5 dB, depending on RF frequency, power levels, and so on.

SUMMARY OF THE INVENTION

Embodiments of the invention concern a wireless transceiver which includes a plurality of RF filters, each having a first and second port. The transceiver includes a first band switching network comprised of a first plurality of RF switches, each respectively connected between the first port of one of the plurality of RF filters and a common transmitter port at which transmitter RF energy is received from a transmitter. The first plurality of RF switches is responsive to at least a first control signal to selectively direct the transmitter RF energy to a selected one of the RF filters. A second band switching network is comprised of a second plurality of RF switches, each respectively connected to the second port of one of the plurality of RF filters and coupled to a common antenna port at which RF energy is communicated to or from an antenna. The second band switching network is responsive to at least a second control signal which selectively controls which of the plurality of RF filters is connected to the common antenna port. The transceiver further includes a T/R switching network comprised of at least one receiver RF switch connected to at least one of the first ports, which is also a T/R port, and to a receiver port at which received RF energy is communicated to a receiver. The receiver RF switch is responsive to at least a third control signal to selectively permit the received RF energy arriving at the at least one T/R port to be communicated to the receiver. A switch control system controls at least the second band-switching network to selectively communicate received RF energy from the common antenna port to an active T/R port which is connected to the receiver port. Each of said first and second plurality of RF switches are PIN diodes switches having a PIN diode in series with a signal path. No more than two PIN diodes are present in the signal path between the common transmitter port and the common antenna port when any of the RF filters is in use.

BRIEF DESCRIPTION OF THE DRAWINGS

Embodiments will be described with reference to the following drawing figures, in which like numerals represent like items throughout the figures, and in which.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

In multi-band wireless transceivers, a plurality of harmonic filters are sometimes provided at the output of the transmitter to reduce harmonic emissions. These harmonic filters are typically comprised of a plurality of low pass type filters, each with a progressively higher cutoff frequency to accommodate a transmitter frequency band of interest. Switching circuits are typically provided so that the different harmonic filters can be switched into or out of the transmit path as needed for operation on a particular frequency band. Notably, these same output filters can often be used in receive mode as well.

Figure 1:
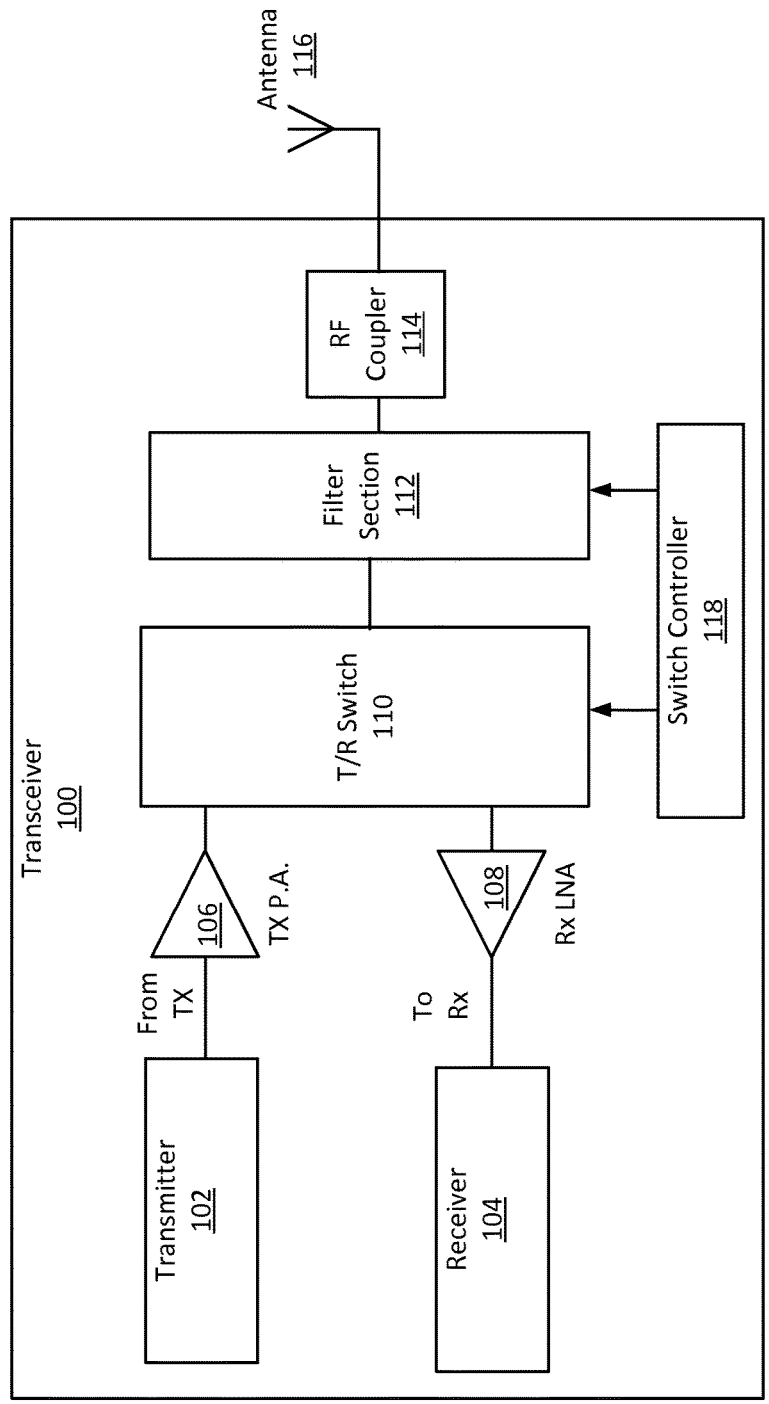
FIG. 1 is a block diagram or a radio transceiver that is useful for understanding the invention.

Referring now to FIG. 1, there is shown a wireless transceiver 100, which includes a transmitter 102, a receiver 104, a transmitter power amplifier 106, a transmit/receive (TR) switch 110, and a filter section 112. The transceiver can also optionally include an RF coupler 114 which can be connected between filter section 112 and an antenna 116. The wireless transceiver will also include a switch controller 118 to control the operation of the T/R switch and any switching associated with filter section 112. The switch controller 118 can comprise any combination of analog or digital circuitry capable of carrying out the switch control functions described herein. A wireless transceiver in accordance with the inventive arrangements can have more or fewer components, but the wireless transceiver shown in FIG. 1 is sufficient to facilitate understanding of the invention.

The transmitter 102 and receiver 104 can be designed to transmit and receive, respectively on one or more frequency bands of interest. The transmitter power amplifier 106 can be a conventional RF power amplifier which increases the power level of transmitted radio frequency (RF) signals produced by the transmitter 106 prior to such signals being communicating to the antenna 116. Low noise amplifier 108 can be a conventional high-performance amplifier with a relatively low noise figure that is designed to amplify relatively weak received signals coupled from the antenna 116. For convenience, the transmitter power amplifier 106 is shown separately from the transmitter 102 in FIG. 1, but those skilled in the art will appreciate that the transmitter power amplifier can also be considered as part of the transmitter 102. Similarly, a receiver low noise amplifier 108 is shown as a separate component with respect to the receiver 104, but can be understood to be a part of the receiver circuitry 104.

The T/R switch 110 is used to selectively control access to the antenna 116 as between the transmitter 102 and the receiver 104. The T/R switch must protect the sensitive components of the receiver low-noise amplifier 108 from the relatively high RF power levels output by the transmitter power amplifier 106. Accordingly, the T/R switch must provide a high degree of RF signal isolation as between the output of the transmitter power amplifier and the input of the receiver low noise-amplifier. Filter section 112 is coupled intermediate of the T/R switch 110 and RF coupler 114. The filter section advantageously includes a plurality of RF filters which are used for filtering RF signals which are received and transmitted. For example, in a multiband transceiver, the RF filters can include a plurality of low-pass filters, each with a somewhat higher cutoff frequency to accommodate operations on different frequency bands. Different ones of the plurality of RF filters can be advantageously used when receiving and/or transmitting on different frequency bands of interest. A plurality of switches is advantageously included in the filter section 112 to facilitate selecting among the plurality of RF filters when operating on different frequency bands. RF coupler 114 is optionally provided in transceiver 100 to sample transmitted RF output signals before such signals are communicated to the antenna.

Figure 2:
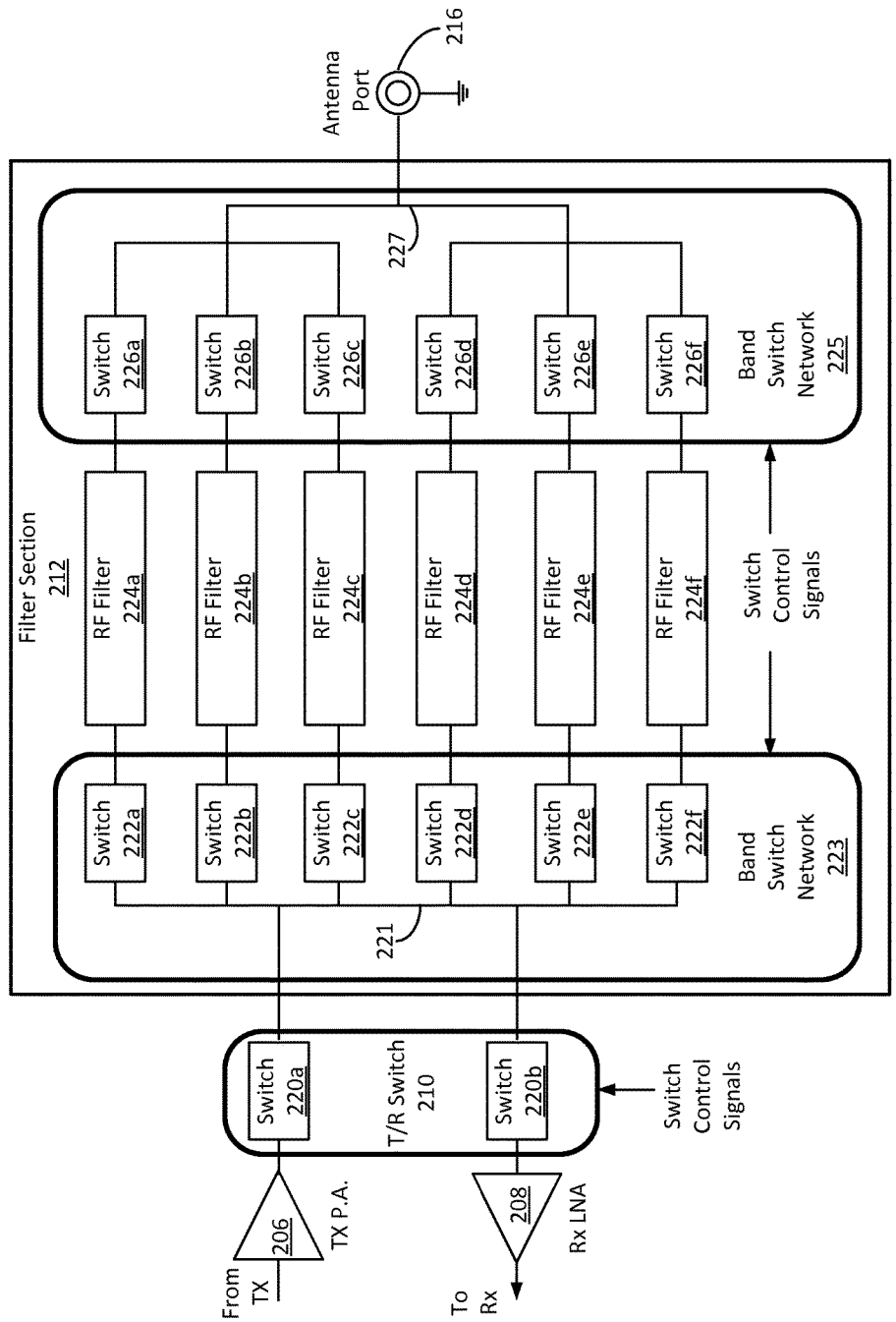
FIG. 2 is a block diagram of a transceiver section showing a conventional switching arrangement for a plurality of harmonic filters.

Referring now to FIG. 2, there is shown a conventional arrangement of a T/R switch and filter section as may be used in a wireless transceiver similar to wireless transceiver 100. The conventional T/R switch 210 is coupled to a transmitter power amplifier 206 and a receiver low-noise amplifier 208 as shown. A first switch 220a is used to selectively connect the power amplifier 206 to a common node 221 associated band switch network 223. A second switch 220b connects the common node 221 to the receiver low-noise amplifier 208. Accordingly, by selectively controlling the switches 220a, 220b using switch control signals, the T/R switch can control whether the common node 221 is connected to the transmitter power amplifier 206 or the receiver low noise amplifier 208.

The band switch network 223 is comprised of a plurality of RF switches 222a-222f. Each of the RF switches is connected between the common node 221 of the band switching network and a first port of one of the plurality of RF filters 224a-224f. These harmonic filters are typically comprised of a plurality of low pass type filters, each with a progressively higher cutoff frequency to accommodate a transmitter frequency band of interest. In the band switch network 225, a plurality of RF switches 226a-226f are connected between a common node 227 and a second port of one of the plurality of RF filters. Accordingly, the second band switch network 225 effectively controls which RF filter 224a-224f is connected to antenna port 216. Note that an RF coupler is not shown in FIG. 2 but could be interposed between the common node 227 and the antenna port 216. The switching networks 223, 225 are provided so that the different harmonic filters can be switched into or out of the transmit path as needed for operation on a particular frequency band. Notably, these same output filters can often be used in receive mode as well.

With the arrangement shown in FIG. 2, an antenna can be coupled to either the transmitter or receiver. Transmitted RF signals from the transmitter power amplifier 206 can be effectively routed through any RF filter 224a-224f before being communicated to the antenna port for transmission. Likewise, received RF signals from the antenna port 216 can be routed through any of the RF filters 224a-224f before being communicated to the receiver low-noise amplifier 208.

In order to facilitate fast switching time and high reliability, PIN diode based switches are commonly used to perform RF switching functions in a wireless transceiver. Moreover, to achieve a high level of RF signal isolation, PIN diode based switches in a series-shunt configuration are commonly used for this purpose. As such, pin diode based switches in series-shunt configuration are conventionally used to implement switches 220a, 220b, 222a-222f, and 226a-226f.

Figure 3B:
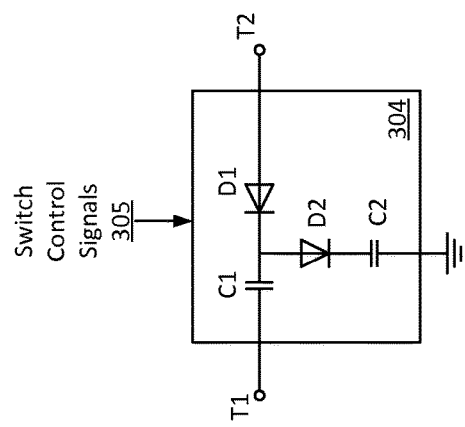
FIGS. 3A and 3B are drawing that are useful for understanding the operation of a PIN diode switch.
Figure 3A:
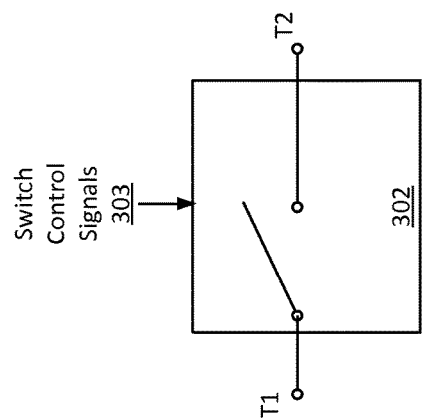

FIG. 3A is a schematic drawing of a single pole single throw switch (SPST) switch 302, which is useful for representing the function of switches 220a, 220b, 222a-222f, and 226a-226f. One or more switch control signals 303 can be applied to control the operation of the switch. FIG. 3B is a somewhat more detailed schematic diagram which shows a pin-diode type switch 304 having a series-shunt configuration as is commonly used to implement a SPST in a transceiver switching scenario as shown in FIGS. 1 and 2. The switch 304 is comprised of a series diode D1 and a shunt diode D2 which are selectively biased to control the operation of the switch. Switch control signals 305 are used to control the selective bias voltage applied to the diodes. Capacitors C2 and C2 are used for blocking the DC bias voltages so that such bias voltages are not coupled to circuits external of the switch. The bias circuitry is not shown in FIG. 3B so as to avoid obscuring the invention. However, it will be appreciated that bias circuits for PIN diode switches as described herein are well known in the art, and any suitable bias circuit can be used for purposes of implementing the inventive arrangements.

The operation of pin-diode switches having a series-shunt configuration are well known and therefore will not be described here in detail. However, a brief explanation is provided for the convenience of the reader. In operation, RF signals in switch 304 can be communicated from T1 to T2 with relatively low loss (e.g., typically 0.1 to 0.5 dB, depending on conditions of frequency, power level and so on) when the switch is in a low insertion loss state. In the low insertion loss state, D1 is forward biased and D2 is at zero or reverse bias. In this low insertion loss state, it can be said that T1 is coupled or connected to T2. Conversely, a high degree of RF signal isolation is obtained between T1 and T2 when D1 is at zero or reverse bias and D2 is forward biased. In this high isolation state, it can be said that T1 is decoupled or disconnected from T2. The bias voltages applied to D1 and D2 are determined in accordance with the switch control signal(s) which control whether the switch is in a low insertion loss state as compared to a high isolation state.

A PIN diode switching arrangement as shown and described herein with respect to FIGS. 2 and 3 can be effective but also suffers from certain drawbacks. As shown in FIG. 3, each switch 220a, 220b, 222a-222f, and 226a-226f will include one PIN diode (e.g. D1) which is disposed in series between the switched terminals T1 and T2. Each such PIN diode in series will typically cause approximately 0.1 to 0.5 dB of signal loss (depending on frequency, power level and so on) when the switch is biased to the low insertion loss state and an RF signal is communicated between T1 to T2. Therefore, in a switching arrangement as shown in FIG. 2, a relatively high insertion loss will result because there are always three (3) switches a signal must transit in the transmit path and in the receive path. For example, if RF filter 224d is required in a particular scenario, then transmitted RF signals will pass through RF switches 220a, 222d and 226d. The transmitted RF signal will transition one series PIN diode in each switch, for a total of three.

In the receive path, the presence of 0.1 to 0.5 dB of loss has relatively little impact on system performance. However, the same amount of loss in the transmit path can have a significant impact on battery life. Consider an exemplary scenario in which a handheld transceiver 100 is specified to produce 5 watts of RF output and each switch 220a, 220b, 222a-222f, and 226a-226f has 0.2 dB of insertion loss. If we assume 3 dB of loss in the transmitter output path and 35% power efficiency, then 0.2 dB of additional loss in the transmit path can potentially equate to 1.4 watts of DC power consumption. Accordingly, relatively small losses in the transmit path can equate to significant detriment to transceiver battery life.

Figure 4:
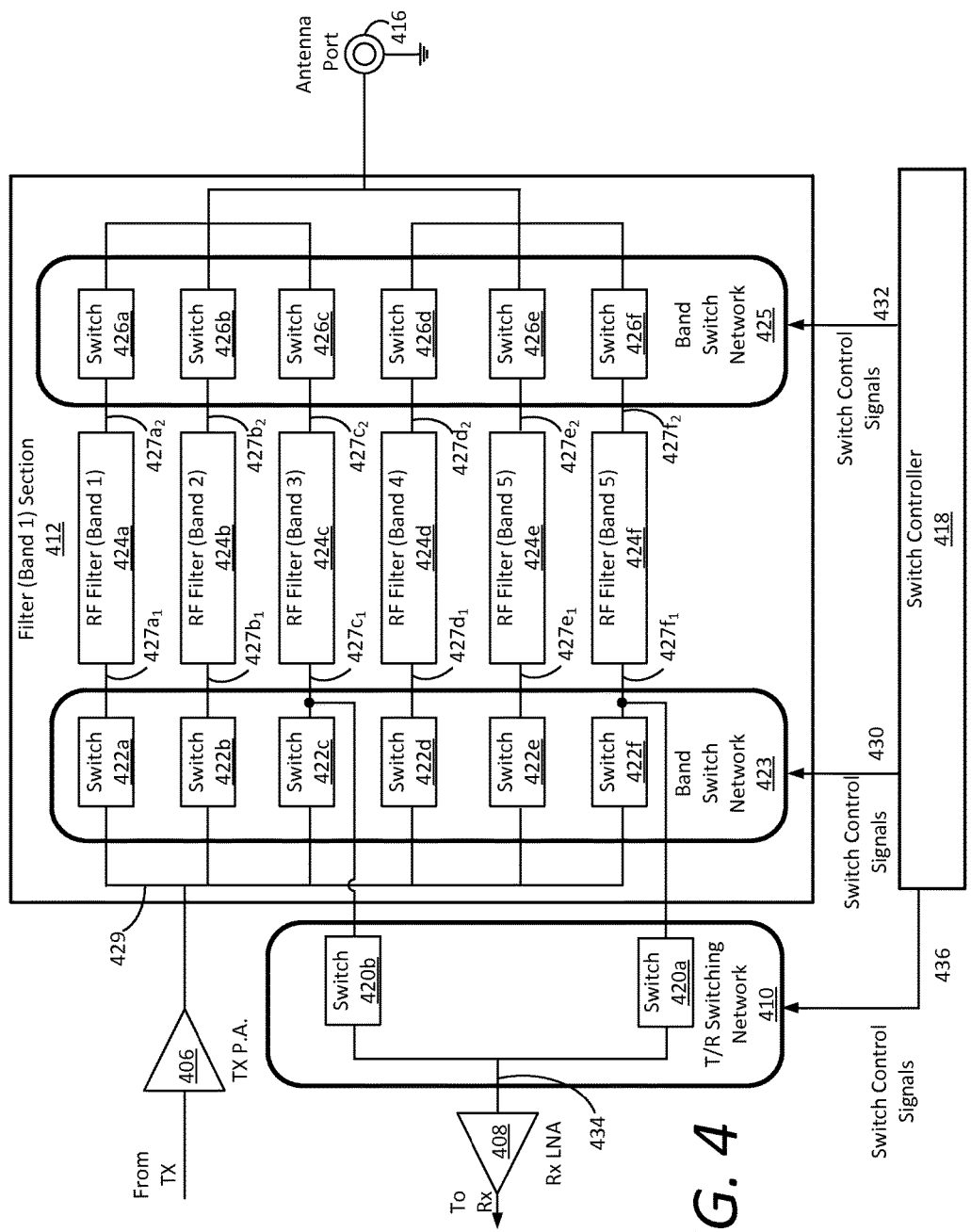
FIG. 4 is a block diagram that is useful for understanding a transceiver section with a switching arrangement for a plurality of harmonic filters, in which only two series PIN diodes are required in the transmit path.

Referring now to FIG. 4, there is shown an improved arrangement for PIN diode T/R switching in a wireless transceiver, such as wireless transceiver 100. The arrangement is particularly valuable for use in handheld transceivers in which series-shunt PIN diode switches are used and battery life is an important design consideration.

As shown in FIG. 4, a filter section 412 includes a plurality of RF filters 424a-424f, each having a first port $427a_1$-$427f_1$ and a second port and $427a_2$-$427f_2$. According to one aspect of the invention, the harmonic filters are comprised of a plurality of low pass type filters, each with a progressively higher cutoff frequency to accommodate a different transmitter frequency band of interest. Switching networks are provided so that the different harmonic filters can be switched into or out of the transmit path as needed for operation on a particular frequency band. For example, a first band switching network 423 is comprised of a first set of RF switches 422a-422f. Each of these RF switches are respectively connected between a first port of one of the plurality of RF filters 422a-422f and a common transmitter node or port 429 at which transmitter RF energy is received from a transmitter or power amplifier. The RF switches 422a-422f are responsive to one or more switch control signals 430 to selectively determine which RF filter is connected or coupled to the common transmitter port. Accordingly, the RF switches 422a-422f can selectively control or direct the transmitter RF energy so it exclusively applied to a first port of only one of the RF filters 424a-424f.

The filter section also includes a second band switching network 425 comprised of a second group of RF switches 426a-426b. Each of these RF switches 426a-426b is respectively connected to the second port of one of the plurality of RF filters and to a common antenna port 416 at which RF energy is communicated to or from an antenna. The RF switches 426a-426f are responsive to one or more switch control signals 432 to selectively determine which RF filter is connected or coupled to the common antenna port. Accordingly, the RF switches 426a-426f can be controlled so that only one of the RF filters is coupled to the antenna port. A switch controller 418 can be used to control the RF switches 422a-422f and 426a-426f. The switch controller 418 can comprise any arrangement of circuitry capable of directly or indirectly biasing the PIN diodes switches for carrying out the switch operations described herein.

A T/R switching network 410 is connected to the switching network 412 to facilitate transmit and receive switching. The T/R switching network is comprised of at least one receiver RF switch that is connected to at least one of the first ports $427a_1$-$427f_1$, which is also defined herein as a T/R port. For example, FIG. 4 shows that switch 420a and 420b are respectively connected to first ports $427c_1$ and $427f_1$. Each switch 420a, 420b is also connected to a receiver port 434 at which received RF energy is communicated to a receiver. For example, receiver port 434 can be connected or coupled to a low-noise amplifier 408 associated with a receiver (e.g. receiver 104). The one or more RF switches 420a, 420b associated with the T/R switching network are responsive to one or more control signals 436 to selectively control whether the switches are in the low insertion loss state, or high isolation state. As such, the state of RF switches 420a, 420b determines whether received RF energy arriving at a first port of a particular RF filter (e.g. RF filter 420a or 420b) will be communicated to the input of the receiver.

The operation of the circuit in FIG. 4 will now be described in greater detail. In transmit mode, the switch control signals 430, 432 will respectively control each band switch network 423, 425 to determine the transmit path from transmitter port 429 to antenna port 416. For example, when operating on a particular frequency band, RF filter 424d may be most suitable for controlling harmonic emissions. In such a scenario, RF switches 422d and 426d can be controlled so as to be in their low-insertion loss (closed) state, thereby providing a low-insertion loss path through RF filter 424d. All other RF switches in band switch networks 423, 425 can be in the high isolation (open) state so as to restrict or prevent the flow of RF energy through the remaining RF filters. In such a scenario, RF switches 420a, 420b are also in their high isolation (open) state so that high power RF signals from the transmitter port 429 cannot be communicated to the receiver port 434. When operating on a different frequency band, RF filter 424a may be most suitable for controlling harmonic emissions. Accordingly, RF switches 422a and 426a can be controlled so as to be in their low-insertion loss (closed) state, thereby providing a low-insertion loss path through RF filter 424a. All other RF switches in band switch networks 423, 425 can be in the high isolation (open) state so as to restrict or prevent the flow of RF energy through the remaining RF filters. RF switches 420a, 420b remain in their high isolation (open) state so that high power RF signals from the transmitter port 429 cannot be communicated to the receiver port 434.

Notably, in the embodiment shown in FIG. 4, only two PIN diode switches are present in the transmit path, regardless of which RF filter is selected. For example, if RF filter 424d is in use, then only RF switches 422d and 426d are present in the transmit path. This is in contrast to the conventional switching circuit shown in FIG. 2, where three PIN diode switches are always present in the transmit path.

When operating conditions require a transition to receive mode, band switch network 425 is used to route received RF signals from the antenna port 416 to a selected RF filter. For example, band switch network 425 can be used to exclusively route received RF signals to any of the second ports $427a_2$-$427f_2$. In FIG. 4, the RF switches 420a, 420b in the T/R switching network are respectively connected to ports $427f_1$ and $427c_1$ and these ports are therefore also designated as T/R ports. Accordingly, the band switch network can exclusively route received RF signals to one of the T/R ports and received signals will be processed using RF filter 424c or 424f. Thereafter, RF switches 420a, 420b are used to control which of the T/R ports is connected to the receiver port 434. The switch controller 418 can be used to generate or coordinate switch control signals 436 to control the RF switches in the T/R switching network.

In an embodiment of the invention where each of the RF filters is a low pass filter, and each has a progressively higher cutoff frequency, those RF filters with higher cutoff frequencies can often facilitate acceptable receive performance when used in place of RF filters with a lower cutoff frequency. For example, assume that RF filters 424a-424f are each low pass filters having progressively higher cutoff frequencies, with RF filter 424a having the lowest cutoff frequency and RF filter 424f having the highest cutoff frequency. In such a scenario, RF filter 424f can pass all frequencies in the passband of RF filters 424a-424e since all such frequencies are lower than the cutoff frequency of RF filter 424f. Accordingly, for receive operation; RF filter 424f can in certain scenarios provide adequate filtering on all frequency bands. In that case, switch 420b would not be necessary and all receive signals would be instead routed through RF filter 424f and switch 420a. An advantage of this approach is that only one PIN diode switch (420a) is needed in the T/R switching network.

In other receiving scenarios, it may be desirable to use an RF filter with a lower cutoff frequency for one or more operating bands of a multiband transceiver. For example, it may be desirable to use RF filter 424c when receiving signals associated with Bands 1, 2 and 3, and to use RF filter 424f when receiving signals associated with Bands 4, 5, and 6. This approach would require the use of two PIN diode switches (420a, 420b) in the T/R switching network 423, but offers better control of receiver filtering.

According to another scenario, it may be desirable to use a different specific one of the RF filters 424a-424f for receiver operations when performing receive operations on each transceiver band. In that case, instead of just two RF switches 420a, 420b, the T/R switching network 410 can include one PIN diode switch for each RF filter. Each of these switches would be respectively connected between the receiver port 434 and one of the RF filters at ports $427a_2$-$427f_1$. The receiver path in that scenario would be determined by the T/R switching network and the band switch network 425. In each of the foregoing scenarios, switches 422a-422f can be set to their high isolation (open) state so that the receiver circuitry is isolated from the transmitter power amplifier 406.

The inventive arrangements utilize existing PIN diode switches associated with the selection of transmitter harmonic filters (i.e., filters 424a-424f) to facilitate RF switching. The result is a reduced parts count since fewer RF switches are required. Moreover, substantial power savings can be realized in a transceiver incorporating the inventive switching arrangements as described herein. Reducing the number of diodes in the transmit path from three to two will reduce power losses by an estimated 1.4 Watts of DC power. In a battery-powered handheld transceiver, the reduced power consumption during transmit can have a significant effect for purposes of extending battery life. Three series diodes will remain in the receive path, but this does not significantly affect transceiver performance.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

The invention claimed is:

1. A wireless transceiver, comprising:
a plurality of Radio Frequency ("RF") filters, each said RF filter having a first port and a second port;
a first band switching network comprised of a first plurality of RF switches, each RF switch of the first plurality of RF switches connected to the first port of a respective one of the plurality of RF filters and coupled to a common transmitter port at which transmitter RF energy is received from a transmitter, the first plurality of RF switches responsive to at least a first control signal to selectively direct said transmitter RF energy to a selected one of the plurality of RF filters;
a second band switching network comprised of a second plurality of RF switches, each RF switch of the second plurality of RF switches connected to the second port of a respective one of the plurality of RF filters and coupled to a common antenna port at which RF energy is communicated to or from an antenna; and a Transmit/Receive ("T/R") switching network comprised of at least one receiver RF switch that is provided in addition to the first and second plurality of RF switches, the at least one receiver RF switch connected directly to at least one of the first ports, which is also a T/R port, and coupled to a receiver port at which received RF energy is communicated to a receiver, the at least one receiver RF switch responsive to at least a second control signal to selectively permit the received RF energy arriving at the T/R port to be communicated to the receiver.

2. The wireless transceiver according to claim 1, wherein the second band switching network is responsive to at least third control signal which selectively controls which of the plurality of RF filters is connected to the common antenna port.

3. The wireless transceiver according to claim 1, wherein the second band switching network is responsive to at least a third control signal to selectively communicate received RF energy from the common antenna port to the T/R port when the T/R switching network permits the received RF energy arriving at the T/R port to be communicated to the receiver.

4. The wireless transceiver according to claim 1, wherein each of the first and second plurality of RF switches is a Positive-Intrinsic-Negative ("PIN") diode switch having at least one PIN diode disposed in series with a signal transmission path of the transmitter RF energy.

5. The wireless transceiver according to claim 1, wherein the at least one receiver RF switch is a Positive-Intrinsic-Negative ("PIN") diode switch having PIN diodes arranged in a series-shunt configuration.

6. The wireless transceiver according to claim 1, wherein the T/R switching network includes a plurality of the receiver RF switches respectively connected to a plurality of the first ports which are T/R ports, and to the receiver port at which the received RF energy is communicated to the receiver.

7. The wireless transceiver according to claim 6, wherein the plurality of receiver RF switches are responsive to at least the second control signal to selectively permit the received RF energy arriving at only one of the T/R ports to be communicated to the receiver.

8. The wireless transceiver according to claim 7, wherein the first port at each of the RF filters is a T/R port and one of the plurality of receiver RF switches is provided for each T/R port.

9. The wireless transceiver according to claim 7, wherein a switching control system coordinates operation of the second band switching network with the T/R switching network to selectively communicate received RF energy from the common antenna port to the T/R port which is concurrently permitting the received RF energy arriving at the T/R port to be communicated to the receiver.

10. The wireless transceiver according to claim 1, wherein the plurality of RF filters are low-pass filters, each defining a low pass filter band with a different cut-off frequency and only one T/R port is provided, wherein the RF filter which is associated with the one T/R port is the RF filter that has the highest cut-off frequency of any of the plurality of RF filters.

11. The wireless transceiver according to claim 1, wherein only two series diodes are present in each transmit path defined in the wireless transceiver from the common transmitter port to the common antenna port when any of the RF filters is in use.

12. A wireless transceiver, comprising:

a plurality of Radio Frequency ("RF") filters, each said RF filter having a first port and a second port;

a first band switching network comprised of a first plurality of RF switches, each RF switch of the plurality of RF switches connected to the first port of a respective one of the plurality of RF filters and coupled to a common transmitter port at which transmitter RF energy is received from a transmitter, the first plurality of RF switches responsive to at least a first control signal to selectively direct said transmitter RF energy to a selected one of the plurality of RF filters;

a second band switching network comprised of a second plurality of RF switches, each RF switch of the second plurality of RF switches connected to the second port of a respective one of the plurality of RF filters and coupled to a common antenna port at which RF energy is communicated to or from an antenna, the second band switching network responsive to at least a second control signal which selectively controls which of the plurality of RF filters is connected to the common antenna port; and a Transmit/Receive ("T/R") switching network comprised of at least one receiver RF switch that is provided in addition to the first and second plurality of RF switches, the at least one receiver RF switch connected directly to at least one of the first ports, which is also a T/R port, and coupled to a receiver port at which received RF energy is communicated to a receiver, the at least one receiver RF switch responsive to at least a third control signal to selectively permit the received RF energy arriving at the at least one T/R port to be communicated to the receiver; and a switch control system which controls the second band-switching network to selectively communicate received RF energy from the common antenna port to an active T/R port which is connected to the receiver port;

wherein each of said first and second plurality of RF switches are Positive-Intrinsic-Negative ("PIN") diode switches having a PIN diode in series with a signal path, whereby no more than two PIN diodes are present in the signal path between the common transmitter port and the common antenna port when any of the RF filters is in use.

13. The wireless transceiver according to claim 12, wherein the at least one receiver RF switch is a PIN diode switch.

14. The wireless transceiver according to claim 12, wherein the at least one receiver RF switch is a PIN diode switch having PIN diodes arranged in a series-shunt configuration.

15. The wireless transceiver according to claim 12, wherein the T/R switching network includes a plurality of the receiver RF switches respectively connected to a plurality of the first ports which are T/R ports, and to the receiver port at which the received RF energy is communicated to the receiver.

16. A wireless transceiver, comprising:

a plurality of Radio Frequency ("RF") filters, each said RF filter having a first port and a second port;

a first band switching network comprised of a first plurality of RF switches, each said RF switch of the plurality of RF switches connected to the first port of a respective one of the plurality of RF filters and coupled to a common transmitter port at which transmitter RF energy is received from a transmitter, the first plurality of RF switches responsive to at least a first control signal to selectively direct said transmitter RF energy to a selected one of the plurality of RF filters;

a Transmit/Receive ("T/R") switching network comprised of at least one receiver RF switch connected directly to at least one of the first ports, which is also a T/R port, and coupled to a receiver port at which received RF energy is communicated to a receiver, the at least one receiver RF switch responsive to at least a second control signal to selectively permit the received RF energy arriving at the T/R port to be communicated to the receiver; and a second band switching network responsive to at least a third control signal to selectively communicate received RF energy from a common antenna port, through one of the plurality of RF filters, to the T/R port which is active when the T/R switching network causes the received RF energy arriving at the T/R port that is active to be communicated to the receiver;

wherein only two series Positive-Intrinsic-Negative ("PIN") diodes are present in each transmit path defined in the wireless transceiver from the common transmitter port to the common antenna port when any of the RF filters is in use.

17. The wireless transceiver according to claim 16, wherein each of the first plurality of RF switches and the at least one receiver RF switch is a PIN diode switch.

18. The wireless transceiver according to claim 16, wherein the at least one receiver RF switch is a PIN diode switch having PIN diodes arranged in a series-shunt configuration.

19. The wireless transceiver according to claim 16, wherein the plurality of RF filters are low-pass filters, each defining a low pass filter band with a different cut-off frequency and only one T/R port is provided, wherein the RF filter which is associated with the one T/R port is the RF filter that has the highest cut-off frequency of any of the plurality of RF filters.

* * * * *